United States Patent [19]
Noguchi

[11] Patent Number: 6,075,292
[45] Date of Patent: Jun. 13, 2000

[54] SEMICONDUCTOR DEVICE AND METHOD OF MANUFACTURING THE SAME IN WHICH DEGRADATION DUE TO PLASMA CAN BE PREVENTED

[75] Inventor: Ko Noguchi, Tokyo, Japan

[73] Assignee: NEC Corporation, Tokyo, Japan

[21] Appl. No.: 09/114,171

[22] Filed: Jul. 13, 1998

[30]  Foreign Application Priority Data

Jul. 18, 1997 [JP] Japan ................................. 9-194447

[51] Int. Cl.⁷ ........................... H01L 23/48; H01L 23/52; H01L 29/40
[52] U.S. Cl. .......................... 257/758; 257/774; 257/750; 257/752; 257/760
[58] Field of Search ................................ 257/758, 774, 257/750, 752, 760

[56]  References Cited

U.S. PATENT DOCUMENTS

| 5,393,701 | 2/1995 | Ko et al. | 437/193 |
| 5,650,651 | 7/1997 | Bui | 257/355 |
| 5,828,119 | 10/1998 | Katsube | 257/491 |

FOREIGN PATENT DOCUMENTS 6-204467  7/1994  Japan .
7-235541  9/1995  Japan .

*Primary Examiner*—Mahshid Saadat
*Assistant Examiner*—Jhihan B Clark
*Attorney, Agent, or Firm*—Sughrue, Mion, Zinn, Macpeak & Seas, PLLC

[57]  ABSTRACT

In a semiconductor device, a metal oxide semiconductor (MOS) transistor is formed on a semiconductor substrate to have a gate electrode which is formed on a gate oxide film. The first insulating layer is formed to cover the semiconductor substrate and the MOS transistor. The second insulating layer is formed to cover the first insulating layer. The first wiring structure is formed on the first insulating layer. A part of the first wiring structure passes through the second insulating layer. The second wiring structure is not connected to the first wiring structure, and passes through the first and second insulating layers to be connected to the gate electrode. The second wiring structure has an antenna ratio of equal to or less than 1000. The third wiring structure is connected to the first and second wiring structures and formed on the second insulating layer to have the antenna ratio of equal to or less than 1000. Here, the antenna ratio is a ratio of surface area of a wiring structure to surface area of a gate oxide film.

8 Claims, 15 Drawing Sheets

SEMICONDUCTOR DEVICE AND METHOD OF MANUFACTURING THE SAME IN WHICH DEGRADATION DUE TO PLASMA CAN BE PREVENTED

BACKGROUND OF THE INVENTION

1. Field of the Invention

The present invention relates to a semiconductor device and a method of manufacturing a semiconductor device in which charging damage of a gate oxide film is reduced.

2. Description of the Related Art

There are known many processes using plasma in a semiconductor manufacturing process. There are problems in the plasma using processes. For instance, a damage to a gate oxide film of a metal oxide semiconductor (MOS) transistor is brought about, or the yield of large-scale integrated circuits (LSI) is reduced. As a device size becomes smaller and the gate oxide film becomes thinner, the degradation becomes worse, and the reliability is further reduced. The mechanism by which the gate oxide film is damaged will be described below with reference to the attached drawings.

FIGS. 1A and 1B are drawings showing a semiconductor device according to a first conventional example. FIG. 1A is a plan view of the semiconductor device, and FIG. 1B is a cross-sectional view of the semiconductor device. A diffusion layer 30 is formed in a region surrounded by a field oxide film 20 for isolating an element, on a surface of a semiconductor substrate 10. A gate electrode 50 is disposed on a gate oxide film 40 on the semiconductor substrate 10. A first insulating film 60 is disposed on the whole portion including the gate electrode 50 and the field oxide film 20. The gate electrode 50 is connected to a contact 70 disposed to pass through the first insulating film 60, and the contact 70 is connected to a first wiring 80 disposed on the first insulating film 60.

The processes using plasma are typically adopted in a process for forming the first wiring 80 and the post-process thereof, among the processes for manufacturing the semiconductor device shown in FIGS. 1A and 1B. For example, this may include a plasma etching method for forming a wiring, a plasma ashing method for removing resist, a plasma chemical vapor deposition (CVD) method for forming an interlayer insulating film, and a plasma etching method for forming a via-hole passing through an interlayer insulating film.

There exist ionized ions and electrons in the plasma. When the semiconductor substrate having the elements as shown in FIGS. 1A and 1B is exposed to plasma in which a balance between positive and negative charges is broken down, the charges enter from a surface of a conductor exposed in the plasma, e.g., the first wiring 80 in a case of FIGS. 1A and 1B, and flow through the gate electrode 50 and the gate oxide film 40 into the semiconductor substrate 10. A current due to the electric charges brings about the electric wear out of the gate oxide film 40, resulting in low reliability of the gate oxide film 40 for long term usage. This is an electrical damage because of the plasma. Hereinafter, this is referred to as a plasma damage.

Thus, a conductor directly exposed to the plasma acts as an antenna for collecting electrical charges. Therefore, the larger the antenna is, the severer the plasma damage becomes. An "antenna ratio" is used as an index for quantitatively representing the degree of the plasma damage. The antenna ratio is defined as a ratio of an area of the conductor exposed to the plasma to an area of the gate oxide film. Hence, in order to reduce the plasma damage, it is necessary to reduce the antenna ratio as small as possible. That is, an area or a length of the wiring connected to the gate electrode is required to be small.

Several processes may cause the plasma damage. For example, they are an etching process for etching the wiring, an ashing process for stripping a resist after the wiring etching, a process for forming an interlayer insulating film by means of a plasma CVD method after the wiring formation, and a via-hole etching process for forming an opening to the insulating film. According to an experiment, the plasma damage brought about by the etching process for forming the wiring is the severest. The plasma damages caused in another plasma processes are practically much lower than that of the wiring etching process.

Next, considering the damage in the plasma etching for forming the wiring, an example of reducing the damage will be described below.

FIGS. 2A and 2B are diagrams showing a second conventional example of a semiconductor device designed to reduce the damage. This example is disclosed in Japanese Laid Open Patent Disclosure (JP-A-Heisei 6-204467). FIG. 2A is a plan view of the semiconductor device, and FIG. 2B is a cross-sectional view of the semiconductor device.

The semiconductor device shown in FIGS. 2A and 2B is formed is the same as in the first conventional example shown in FIGS. 1A and 1B, until the contact 70 is formed. However, the first wiring is provided to be composed of a wiring section 81 connected to a gate electrode 50 and a wiring section 82 which is not connected to the gate electrode 50. A second insulating film 90 is disposed on the entire surface including the first wiring and a first insulating film 60. First via-holes 101 and 102 are disposed in the second insulating film 90 to be connected to the first wiring sections 81 and 82, respectively. On the second insulating film 90, a second wiring 110 is disposed to be connected through the first via-holes 101 and 102 to the first wiring sections 81 and 82.

The second conventional example shown in FIGS. 2A and 2B is important in that the first wiring 80 is provided to be composed of the wiring section 81 connected to the gate electrode 50 and the wiring section 82 which is not connected to the gate electrode 50. When etching is performed to form the first wiring, only the wiring section 81 connected to the gate electrode 50 functions as the charging antenna for collecting electrical charges. Therefore, in the second conventional example, the small antenna ratio is accomplished.

For example, if the length of the wiring section 81 is $\frac{1}{10}$ times shorter than the length of the wiring section 82, the antenna ratio can be also reduced to $\frac{1}{10}$. The electrical connection between the first wiring sections 81 and 82 is accomplished by the second wiring 110 above the first wiring. Moreover, an area of the second wiring 110 can be formed sufficiently small. Thus, the plasma damage because of the second wiring 110 can be reduced small. As a result, the plasma damage of the gate oxide film 40 brought about by the etching process can be reduced sufficiently small.

The second conventional example shown in FIGS. 2A and 2B can protect the gate oxide film from the plasma damage in the etching process and the ashing process for the first wiring, and the forming process for the second insulating film 90.

A method for reducing a damage in forming a pad having a large area for connecting a probe or bonding wire is disclosed in JP-A-Heisei 7-235541 and U.S. Pat. No. 5,393, 701. As an example, Japanese Laid Open Patent Disclosure (JP-A-Heisei 7-235541) will be described below.

FIGS. 3A and 3B are drawings showing a semiconductor device disclosed in the Japanese Laid Open Patent Disclosure (JP-A-Heisei 7-235541). FIG. 3A is a plan view of the semiconductor device, and FIG. 3B is a cross-sectional view of the semiconductor device.

A semiconductor device shown in FIGS. 3A and 3B is explained as follows. A first wiring is disposed on a first insulating film 60, which is disposed on a semiconductor substrate 10. The first wiring is provided to be composed of a wiring section 82 having a large area a part of which is used as a pad electrode 200, and a wiring section 81 having a small area which is not connected with the wiring section 82. A second insulating film 90 is disposed to have two openings reaching the first wiring. One of the two openings is a pad opening 190 having the same size as that of the pad electrode 200. The other opening is a via-hole 100 which extends to a part of the wiring section 81 and a part of the wiring section 82 through the second insulating film 90. Then, a second wiring 110 is disposed at two openings. A second wiring section 111 of the second wiring 110 is disposed in the via-hole 100 to connect the wiring section 81 and the wiring section 82. A second wiring section 112 of the second wiring 110 is disposed on the pad opening 190 to cover the exposed part of the wiring section 82.

In a third conventional example shown in FIGS. 3A and 3B, a gate electrode (not shown) is connected to the wiring section 81 having the small area. In this case, since the antenna ratio can be made small, the damage when etching is performed to form the first wiring 80 can be reduced, as in the second conventional example described with reference to FIGS. 2A and 2B. Moreover, the plasma damage can be reduced when the pad opening 190 is formed on the first wiring 80.

The conventional examples shown in FIGS. 2A, 2B and FIGS. 3A, 3B are effective for reducing the plasma damages brought about in the plasma etching processes to form the first wiring 80, to ash resist, to form the second insulating film 90 and to form the first via-hole 100. However, they can not protect the semiconductor device from the damage brought about in the plasma etching process to form the second wiring 110. Especially, as shown in FIGS. 3A and 3B, when the second wiring 110 is formed to be the pad electrode for connecting a probe or a bonding wire, the pad electrode typically have a large area such as about 100×100 square microns, and the antenna ratio of the pad electrode is also high. As a result, the forming process of the second wiring 110 causes a severe damage to the gate oxide film.

SUMMARY OF THE INVENTION

The present invention is accomplished to solve the above-mentioned problems. Therefore, an object of the present invention is to provide a semiconductor device and a manufacturing method for the same, in which the semiconductor device can be protected from a plasma damage while having a pattern of a high antenna ratio such as a pad electrode.

Another object of the present invention is to provide a semiconductor device and a manufacturing method for the same, in which a plasma damage to a gate oxide film can be reduced.

In order to achieve an aspect of the present invention, a semiconductor device includes a metal oxide semiconductor (MOS) transistor formed on a semiconductor substrate to have a gate electrode which is formed on a gate oxide film, a first insulating layer covering the semiconductor substrate and the MOS transistor, a second insulating layer covering the first insulating layer, a first wiring structure formed on the first insulating layer, a part of the first wiring structure passing through the second insulating layer, a second wiring structure which is not connected to the first wiring structure, which passes through the first and the second insulating layers to be connected to the gate electrode, and which has an antenna ratio of equal to or less than 1000, and a third wiring structure connected to the first and the second wiring structures and formed on the second insulating layer to have the antenna ratio of equal to or less than 1000. Here, the antenna ratio is a ratio of surface area of a wiring structure to surface area of a gate oxide film.

The semiconductor device may further includes a passivation film covering the third wiring structure and the second insulating layer, and a first opening formed to pass through the second insulating layer and the passivation film and connected to the first wiring structure. A part of each of the first and second wiring structures may pass through the second insulating layer and extends vertically upward.

The first insulating layer includes a third insulating layer and a fourth insulating layer formed on the third insulating layer. In this case, the semiconductor device may further include a fourth wiring structure formed on the third insulating layer without being not connected to the second wiring structure, and a second opening formed on the fourth wiring structure to pass through the fourth insulating layer, wherein a part of the first wiring structure on the first insulating layer is overlapped with the fourth wiring structure through the second opening.

The second insulating layer may include a fifth insulating layer and a sixth insulating layer formed on the fifth insulating layer. In this case, the semiconductor device may further include a third opening formed on the first wiring structure to pass through the fifth insulating layer, and a fifth wiring structure formed on the fifth insulating layer and the third opening. A part of the fifth wiring structure is overlapped with a part of the first wiring structure through the third opening without being not connected to the second wiring structure. The second insulating layer may include a seventh insulating layer and an eighth insulating layer formed on the seventh insulating layer. In this case, a part of the first wiring structure includes a first wiring portion formed on the first insulating layer, a second wiring portion formed on the seventh insulating layer, a first contact formed to pass through the seventh insulating layer and to connect the first wiring portion and the second wiring portion, and a second contact formed to pass through the eighth insulating layer to be connected to the second wiring portion. Also, a part of the second wiring structure includes a third wiring portion formed on the first insulating layer, a fourth wiring portion formed on the seventh insulating layer, a third contact formed to pass through the seventh insulating layer and to connect the third wiring portion and the fourth wiring portion, and a fourth contact formed to pass through the eighth insulating layer to be connected to the fourth wiring portion.

The first insulating layer may include the third insulating layer and a fourth insulating layer formed on the third insulating layer. In this case, a part of the first wiring structure passes through the fourth insulating layer and the second insulating layer and extends vertically upward. Each of the first to fourth contacts desirably includes a tungsten plug.

In order to achieve another aspect of the present invention, a method of manufacturing a semiconductor device, includes the steps of:

forming a MOS transistor on a semiconductor substrate, the MOS transistor including a gate electrode formed on a gate oxide film;

forming a first insulating layer to cover the semiconductor substrate and the MOS transistor;

forming a second insulating layer to cover the first insulating layer;

forming a first wiring structure on the first insulating layer such that a part of the first wiring structure passes through the second insulating layer;

forming a second wiring structure to be connected to the gate electrode without being not connected to the first wiring structure, and to pass through the first and second insulating layers, the second wiring structure having an antenna ratio equal to or less than 1000; and forming a third wiring structure on the second insulating layer to be connected to the first and second wiring structures, the third wiring structure having the antenna ratio equal to or less than 1000, wherein the antenna ratio is a ratio of surface area of the wiring structure to surface area of the gate oxide film.

DESCRIPTION OF THE PREFERRED EMBODIMENTS

The semiconductor device of the present invention and the method for manufacturing it will be described below in detail with reference to the attached drawings. At first, a semiconductor device according to a first embodiment of the present invention and a method for manufacturing it will be described below.

Figure 1A:
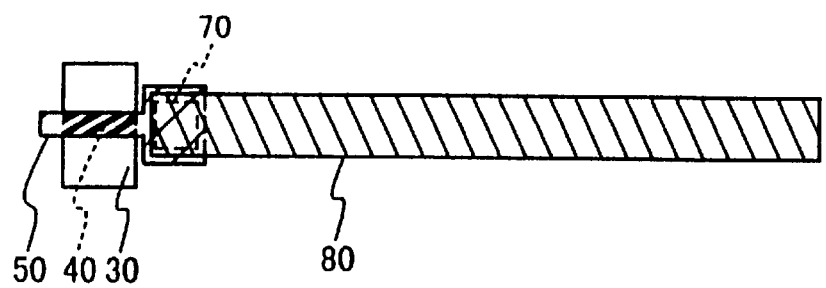
FIGS. 1A and 1B are a plan view and cross-sectional view showing a first conventional example of a semiconductor device.
Figure 1B:
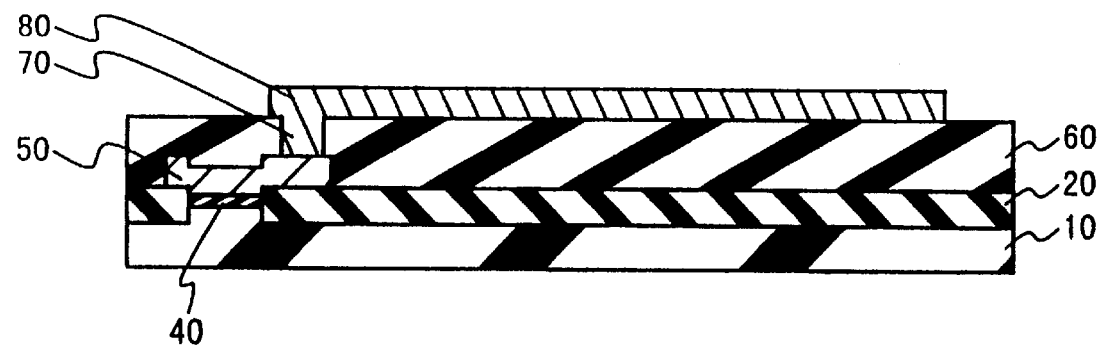
Figure 2A:
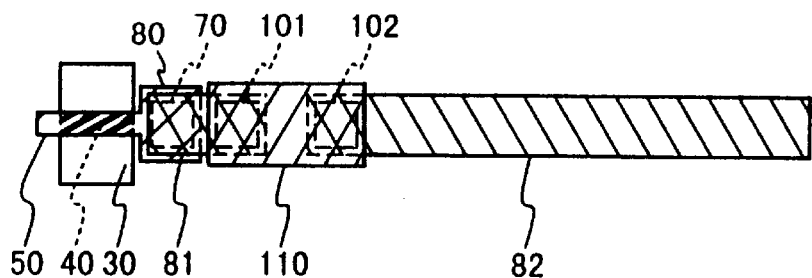
FIGS. 2A and 2B are a plan view and cross-sectional view showing a second conventional example of a semiconductor device.
Figure 2B:
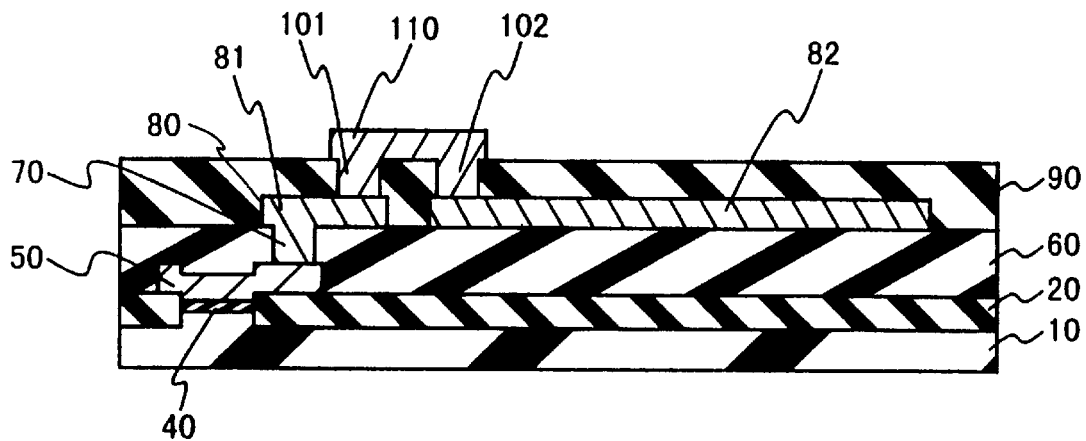
Figure 3A:
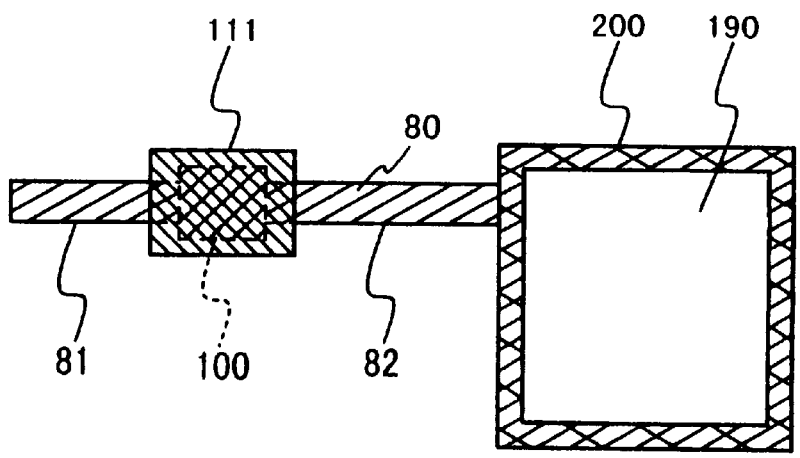
FIGS. 3A and 3B are a plan view and cross-sectional view showing a third conventional example of a semiconductor device.
Figure 3B:
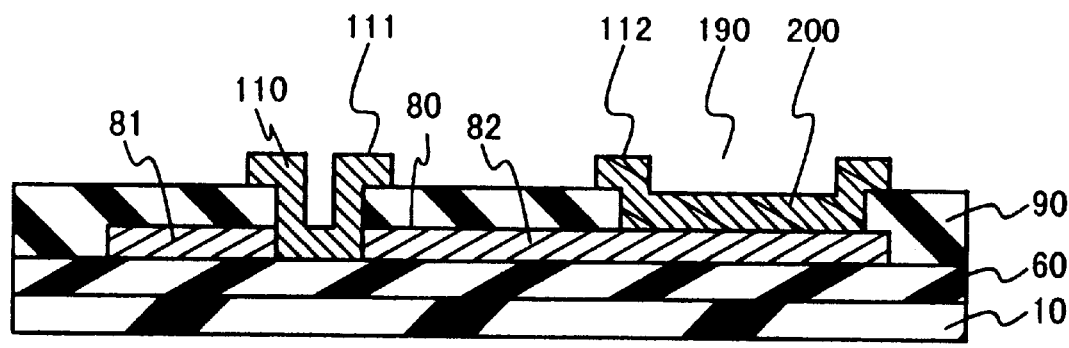
Figure 4A:
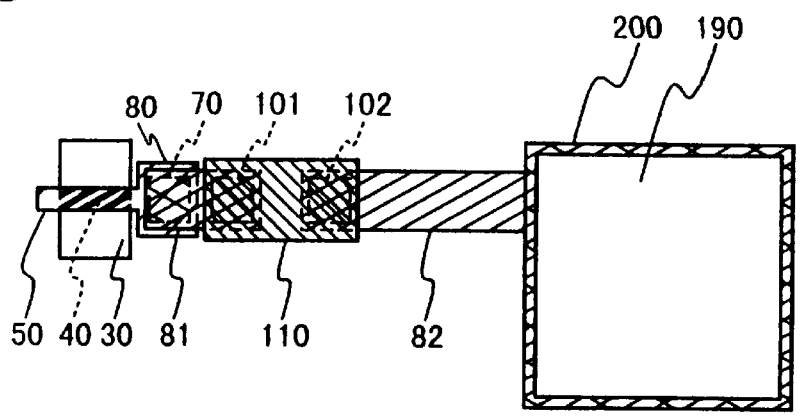
FIGS. 4A and 4B are a plan view and cross-sectional view showing a semiconductor device according to a first embodiment of the present invention.
Figure 4B:
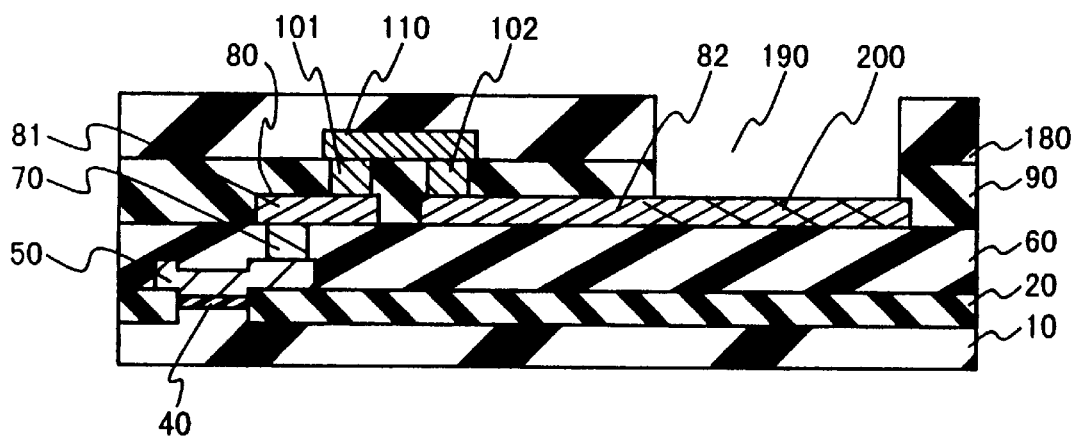

FIGS. 4A and 4B show the structure of the semiconductor device according to the first embodiment of the present invention. FIG. 4A is a plan view of the semiconductor device, and FIG. 4B is a cross-sectional view of the semiconductor device. The structure of the semiconductor device according to the first embodiment of the present invention will be described with reference to FIGS. 4A and 4B.

A diffusion layer 30 exists in a region surrounded by a field oxide film 20 for separating an element, on a surface of a semiconductor substrate 10. A gate electrode 50 is disposed through a gate oxide film 40, which is formed on the semiconductor substrate 10. A first insulating film 60 is disposed on the whole surface of the substrate, including the gate electrode 50 and the field oxide film 20. A contact 70 connected to the gate electrode 50 is disposed to pass through the first insulating film 60. A first wiring 80 is disposed on the first insulating film 60 and the contact 70. The first wiring 80 is provided to be composed of a wiring section 81 connected to the gate electrode 50 and a wiring section 82 which is not connected to the gate electrode 50. A part of the wiring section 82 functions as a pad electrode 200. A second insulating film 90 is disposed to cover the first insulating film 60 and the first wiring 80. First contacts 101 and 102 are formed through the second insulating film 90 and connected to the first wiring sections 81 and 82, respectively.

The second wiring 110 is disposed on the second insulating film 90, and is connected through the second insulating film 90 to the first wiring sections 81 and 82. A passivation film 180 made of a silicon nitride film (a SiN film), a SiON film, a $SiO_2$ film, a polyimide film or the like for the element protection is disposed on the whole surface of the substrate, including the second insulating film 90 and the second wiring 110. A pad opening 190 is disposed through the passivation film 180 and the second insulating film 90 to the pad electrode 200.

The method for manufacturing the semiconductor device according to the first embodiment of the present invention will be described below with reference to FIGS. 9A to 9G.

Figure 9A:
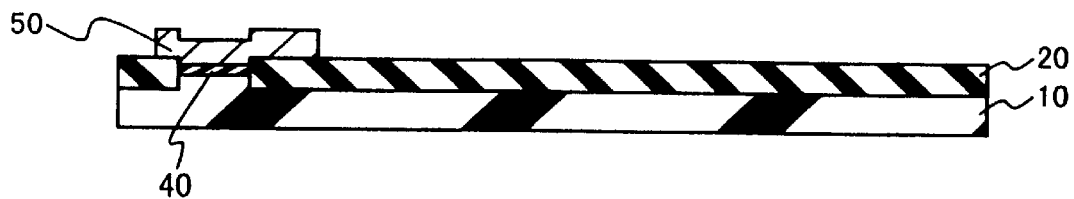
FIGS. 9A to 9G are diagrams showing a method for manufacturing the semiconductor device according to the first embodiment of the present invention.

At first, as shown in FIG. 9A, the field oxide film 20 for the element separation is formed on the semiconductor substrate 10 by use of a well known local oxidation method to have a predetermined shape with a thickness of about 300 nm. As a result, the diffusion layer 30 as an active region of a transistor is formed in a region in which the field oxide film 20 is not formed on the semiconductor substrate 10. Then, the gate oxide film 40 is formed on the surface of the diffusion layer 30 on the semiconductor substrate 10 to have the thickness of 6 nm. A polysilicon film having a thickness of 200 nm is formed on the field oxide film 20 and the gate oxide film 40. Then, the polysilicon film is etched anisotropically to form the gate electrode 50 using a photo-resist having a predetermined shape as a mask. The photo-resist is formed by a typical photolithographic process.

Figure 9B:
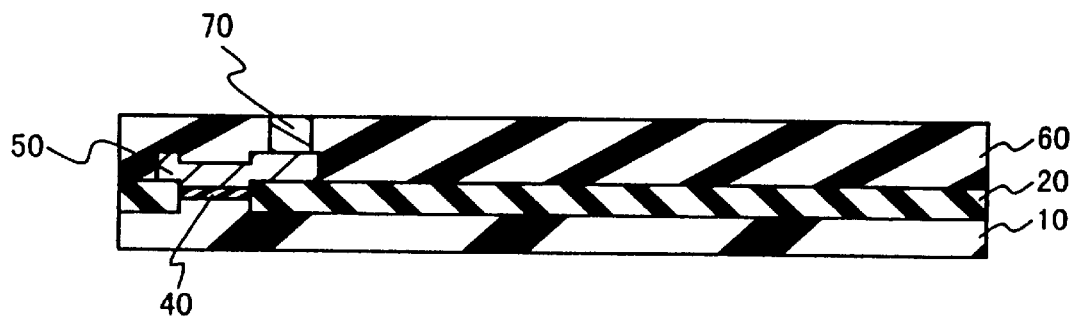

Next, as shown in FIG. 9B, the first insulating film 60 having a thickness of 1000 nm is formed so as to cover the whole surface. For example, BPSG may be used as the material of the first insulating film 60. After that, if necessary, the surface of the first insulating film 60 may be smoothed using a chemical mechanical polishing method.

Subsequently, a contact opening is formed to pass through the first insulating film 60 to the gate electrode 50 by using a photo-resist pattern having a predetermined shape as a mask. The photo-resist pattern is formed by the typical photolithographic process. Then, a tungsten film is grown on the entire surface of the first insulating film 60, including the opening, by using the CVD method. Then, the tungsten layer is etched back such that the tungsten film on the smoothed portion is removed from the entire surface on the first insulating film 60. As a result, the tungsten film remains only in the contact opening to form the contact 70. Here, the chemical mechanical polishing method may be used instead of the etching-back method.

Figure 9C:
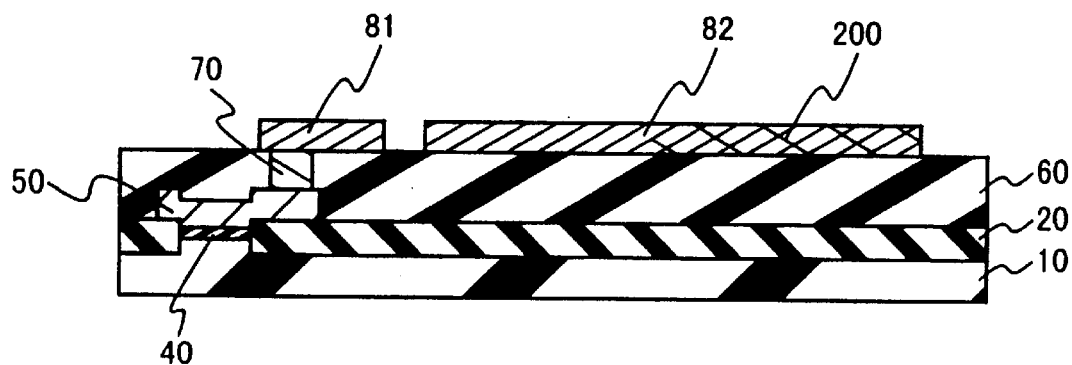

Next, as shown in FIG. 9C, a first wiring 80 is formed. A conductive film having a thickness of 500 nm is formed on the first insulating film 60, including the contact 70, by using a sputtering method. In this case, a conductive film is formed of AlCu as a material of the first wiring 80. Then, the conductive film is etched anisotropically by using a photo-resist pattern having a predetermined shape as a mask. Thus, the first wiring 80 is completed. The first wiring 80 is provided to composed of the wiring section 81 connected to the contact 70 and the wiring section 82 which is not connected to the contact 70. The wiring section 82 includes a portion as the pad electrode 200.

Figure 9D:
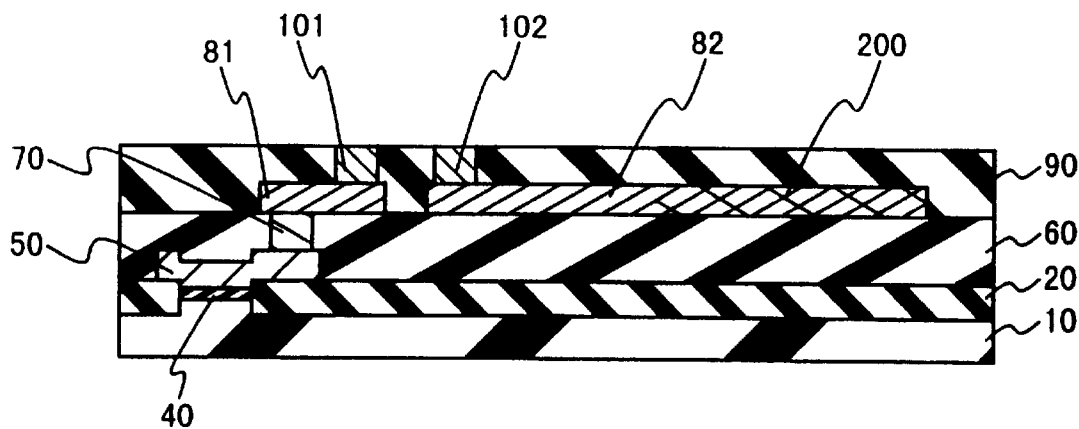

Next, as shown in FIG. 9D, a silicon oxide film having a thickness of 800 nm as the second insulating film 90 is formed by using a plasma method so as to entirely cover the first insulating film 60 and the first wiring 80. The surface of the second insulating film 90 may be smoothed by the chemical mechanical polishing method, if necessary. Then, contact holes are formed through the second insulating film 90 to the first wiring sections 81 and 82, respectively, by using a photo-resist pattern having a predetermined shape as a mask. Then, the tungsten film is embedded into these openings by using the method similar to the method for forming the contact 70. As a result, the first contacts 101 and 102 are formed.

Figure 9E:
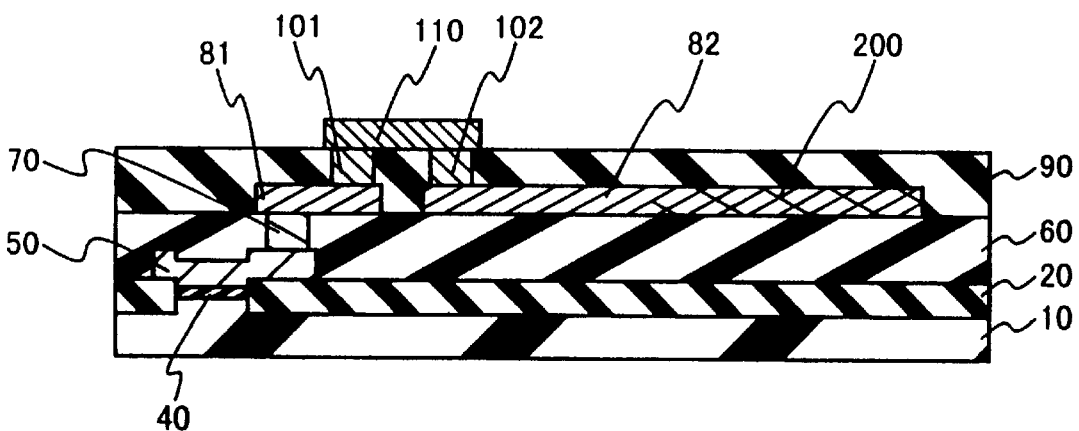

Next, as shown in FIG. 9E, a second wiring is formed. A film having a thickness of 500 nm is formed on the second insulating film 90 including the first contacts 101, 102, by using the sputtering method. In this case, material of the film for the second wiring 110 is AlCu, for example. Subsequently, the film of AlCu is etched anisotropically by using a photo-resist pattern having a predetermined shape as a mask. Thus, the second wiring 110 is completed. The second wiring 110 is intended to connect the first wiring sections 81 and 82 to each other by way of the first contacts 101 and 102. Therefore, the area of the second wiring 110 can be made small.

Figure 9F:
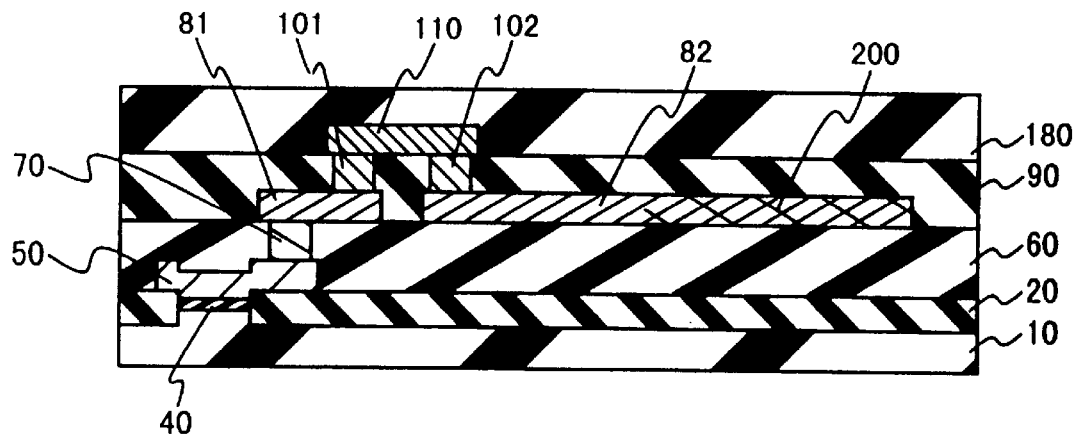

Next, as shown in FIG. 9F, the passivation film 180 for protecting the whole portion including the second wiring 110 is formed by using a single or a combination of a SiN film, a SiOn film, a $SiO_2$ film and/or a polyimide film.

Figure 9G:
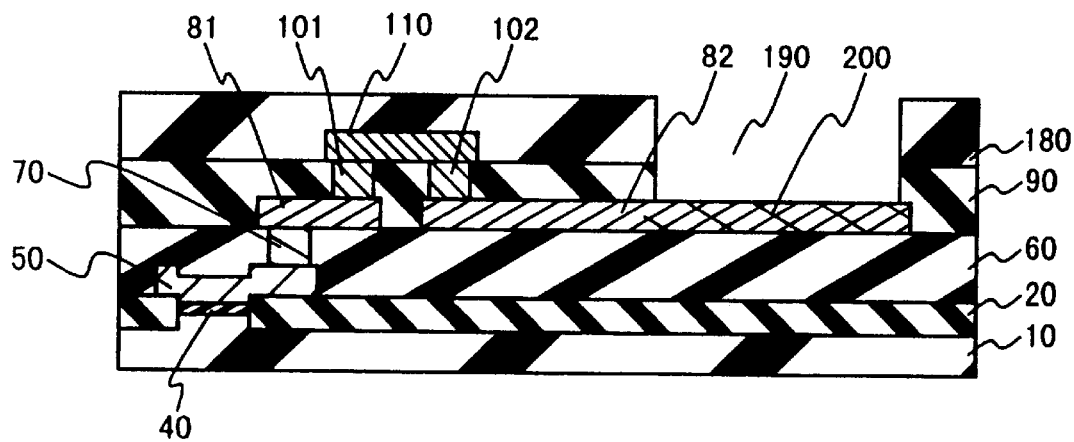

Next, as shown in FIG. 9G, a portion of the second insulating film 90 and a portion of the passivation film 180 on the pad electrode 200 are removed to form the pad opening 190 on the pad electrode 200. A method for forming the pad opening will be described below.

The size of the pad opening 190 is generally large to have about 100×100 square microns. Thus, an etching condition can be selected from among relatively many etching conditions. For example, the plasma damage does not occur, if a wet etching is performed by using a solution whose main component is hydrofluoric acid (HF), even when the passivation film 180 and the second insulating film 110 are made of the $SiO_2$ film. When the passivation film 180 contains the SiN film, the SiON film or the $SiO_2$ film, the plasma etching is performed by using a mixture of a $CHF_3$ gas and a $O_2$ gas, or a $CF_4$ gas as an etching gas. After that, the wet etching is performed by using the solution whose main component is the hydrofluoric acid (HF). The process does not cause any plasma damage to the gate oxide film 40.

Even if the pad opening 190 is formed by the plasma etching, it is easy to select the etching condition under which the plasma damage does not occur. According to an experiment performed by the inventor, the plasma damage does not occur, if the plasma etching is applied to the formation of the pad opening 190 by using a mixture of $CHF_3$ and $O_2$, or a $CF_4$ gas as the etching gas, when the passivation film 180 is made of the SiN film, the SiON film or the $SiO_2$ film and the second insulating film 110 is made of the $SiO_2$ film.

This reason may be considered as follows. When a small opening having a diameter of, for example, 0.5 microns or less such as the contact is formed by the etching method, a small diameter easily results in a problem that the etching rate within the opening is reduced. This is referred to as a micro loading effect. It is effective to make the density of the plasma higher for solving this problem. Moreover, it is necessary to make an anisotropic degree of the etching higher in order to form the small opening with a high accuracy. However, on the contrary, these etching conditions bring about the plasma damage easily. On the other hand, the micro loading effect hardly occurs in the etching of forming the opening with a large area, as in the case of forming the pad opening. Hence, it is not necessary to make the density of the plasma higher. Furthermore, since the etching having a lower anisotropic degree may be used, it is easy to select the condition under which the plasma damage hardly occurs.

The reduction effect of the damage which can be attained in the first embodiment of the present invention will be considered. It is assumed that the gate length of the transistor be 0.25 microns and the gate width be 5 microns. Thus, the area of the gate oxide film 40 becomes 0.25×5=1.25 square microns. When the pad electrode 200 having an area of 100×100 square microns is connected to the gate electrode 50, the antenna ratio becomes 100×100÷1.25=8000. This antenna ratio is sufficiently large to reduce the reliability of the gate oxide film 40 in the usual plasma process.

According to the experiment performed by the inventor, when the antenna ratio is equal to or less than 1000, the damage never occurs when the wiring is etched.

In the first embodiment of the present invention, the plasma damage does not occur even when the pad electrode 200 is formed. This is because the pad electrode 200 is not electrically connected to the gate electrode 50 when the pad electrode 200 is formed.

In a case of the application of the first embodiment of the present invention, if the size of the first wiring section 81 is 0.4 microns in width and 100 microns in length, the antenna ratio is 0.4×100÷1.25=32. Thus, the antenna ratio is decreased to 1/250 of that of the prior art.

Also, the similar effect can be attained with regard to the damage reduction in the ashing process after the wiring is formed and in the process for forming the interlayer insulating film by using the plasma CVD method after the wiring is formed.

It should be noted that each of the contacts is formed of a tungsten plug.

Next, a semiconductor device according to a second embodiment of the present invention and a method for manufacturing it will be described.

Figure 5:
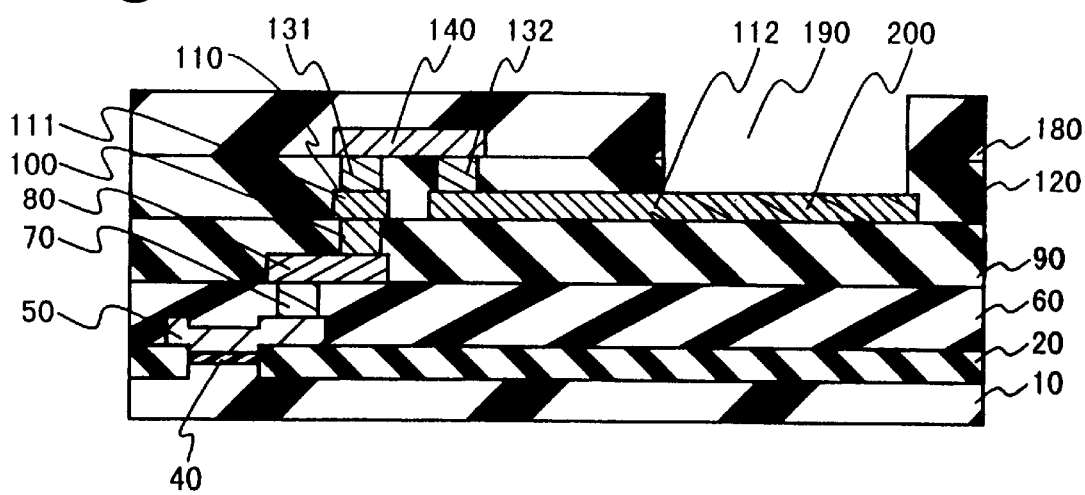
FIG. 5 is a cross-sectional view showing the structure of the semiconductor device according to a second embodiment of the present invention.

FIG. 5 is a cross-sectional view showing the structure of the semiconductor device according to the second embodiment of the present invention.

Referring to FIG. 5, a diffusion layer 30 exists in a region surrounded with a field oxide film 20 for separating a semiconductor element, on a surface of a semiconductor substrate 10. A gate electrode 50 is disposed on a gate oxide film 40 which is formed on the diffusion layer 30. A first insulating film 60 is disposed on the whole portion including the gate electrode 50 and the field oxide film 20. A contact 70 connected to the gate electrode 50 is formed through the first insulating film 60.

A first wiring 80 connected to the gate electrode 50 is disposed on the first insulating film 60 including the surface of the contact 70. A second insulating film 90 is disposed on the whole portion including the first insulating film 60 and the first wiring 80. A first contact 100 is disposed through the second insulating film 90 to be connected to the first wiring 80.

A second wiring 110 is disposed on the second insulating film 90. The second wiring 110 is composed of a wiring section 111 connected to the gate electrode 50 and a wiring section 112 for a pad electrode 200 which is not connected to the gate electrode 50. A third insulating film 120 is disposed on the whole portion including the second wiring sections 111 and 112 and the second insulating film 90. Second contacts 131 and 132 are disposed through the third insulating film 120 to be connected to the second wiring sections 111 and 112, respectively. A third wiring 140 is disposed on the third insulating film 120 to be connected through the second contacts 131 and 132 to the second wiring sections 111 and 112.

A passivation film 180 made of the silicon nitride film such as a SiN film, a SiON film, a $SiO_2$ film, a polyimide film and the like for protecting the element is disposed over the whole portion including the second insulating film 90 and the second wiring 110. A pad opening 190 is disposed through the passivation film 180 and the second insulating film 90 to be connected to the pad electrode 200.

Next, the method for manufacturing the semiconductor device according to the second embodiment of the present invention will be described below with reference to FIGS. 9A to 9G.

At first, the field oxide film 20, the diffusion layer 30, the gate oxide film 40, the gate electrode 50, the first insulating film 60 and the contact 70 are formed on the semiconductor substrate 10 at the same steps as shown in FIGS. 9A and 9B in the first embodiment.

Then, the first wiring 80, the second insulating film 90 and the first contact 100 are formed. The processes for forming them are the same as those in the first embodiment.

Then, the second wiring 110, the third insulating film 120, the third contact 130, the third wiring 140, the passivation film 180, the pad opening 190 and the pad electrode 200 are formed by using the same steps as those shown in FIGS. 9C to 9G in the first embodiment. However, the process of forming the contact 70 in the first embodiment is adopted as the process of forming the first contact 100. Also, the process of forming the first wiring sections 81 and 82 are adopted as the process of forming the second wiring sections 111 and 112. Also, the process of forming the second insulating film 90 is adopted as the process of forming the third insulating film 120. Further, the process of forming the second wiring 110 is adopted as the process of forming the third wiring 140.

The same effect as in the first embodiment can be attained even in the second embodiment of the present invention. That is, any plasma damage is not brought about when the pad electrode 200 is formed. Also, the similar effect can be attained with regard to the damage reduction in the ashing process after the wiring is formed and in the process for forming the interlayer insulating film by using the plasma CVD method after the wiring is formed.

Next, a semiconductor device according to a third embodiment of the present invention and a method for manufacturing it will be described.

Figure 6:
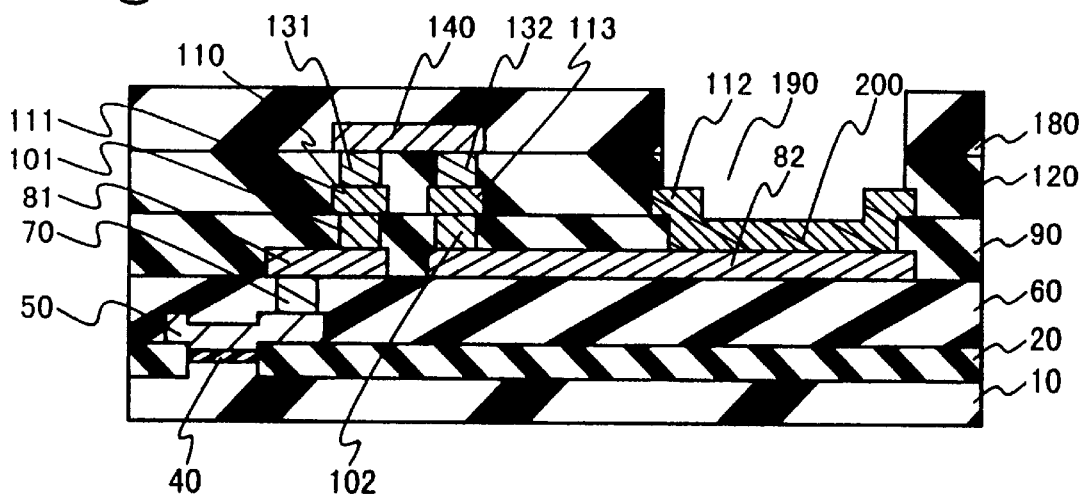
FIG. 6 is a cross-sectional view showing the structure of the semiconductor device according to a third embodiment of the present invention.

FIG. 6 is a cross-sectional view showing the structure of the semiconductor device according to the third embodiment of the present invention. The configuration of the semiconductor device according to the third embodiment of the present invention will be described with reference to FIG. 6.

A diffusion layer 30 exists in a region surrounded with a field oxide film 20 for separating an element, on a surface of a semiconductor substrate 10. A gate electrode 50 is disposed through a gate oxide film 40, which is on the diffusion layer 30. A first insulating film 60 is disposed on the whole portion including the gate electrode 50 and the field oxide film 20. A contact 70 is disposed through the first insulating film 60 to be connected to the gate electrode 50. A first wiring 80 is disposed on the first insulating film 60 including the surface of the contact 70. The first wiring 80 is provided to be composed of a wiring section 81 connected to the gate electrode 50 and a wiring section 82 which is not connected to the gate electrode 50. A part of the wiring section 82 is used for a pad electrode 200. A second insulating film 90 is disposed on the whole portion including the first insulating film 60 and the first wiring 80. First contacts 101 and 102 are disposed through the second insulating film 90 to be connected to the first wiring sections 81 and 82, respectively. In addition to the contacts 101 and 102, an opening 192 is formed through the second insulating film 90.

A second wiring 110 is disposed on the second insulating film 90. The second wiring 110 is composed of a wiring section 111 connected to the gate electrode 50, a wiring section 112 and a wiring section 113. The wiring section 112 is not connected to the gate electrode 50 and functions as the pad electrode 200, and the wiring section 113 is not connected to the gate electrode 50 and is connected to the first contact 102.

The wiring section 112 is overlapped with the part of the first wiring section 82, in the opening 192. A third insulating film 120 is disposed over the whole portion including the second wiring sections 111, 112 and 113 and the second insulating film 90. Second contacts 131 and 132 are disposed through the third insulating film 120 to be respectively connected to the second wiring sections 111 and 113. A third wiring 140 is disposed on the third insulating film 120 to be connected through the second contacts 131 and 132 to the second wiring sections 111 and 113.

A passivation film 180 made of the silicon nitride film such as a SiN film, the SiON film, the $SiO_2$ film, the polyimide film and the like for protecting the element is disposed on the whole portion including the third insulating film 120 and the third wiring 140. A pad opening 190 is disposed within the passivation film 180 and the second insulating film 90 to be connected to the pad electrode 200.

Next, the method for manufacturing the semiconductor device according to the third embodiment of the present invention will be described below with reference to FIGS. 9A to 9C and FIGS. 10A to 10F.

At first, the field oxide film 20, the diffusion layer 30, the gate oxide film 40, the gate electrode 50, the first insulating film 60 and the contact 70 are formed on the semiconductor substrate 10, at the same processes as in the first embodiment shown in FIGS. 9A and 9B.

Figure 10A:
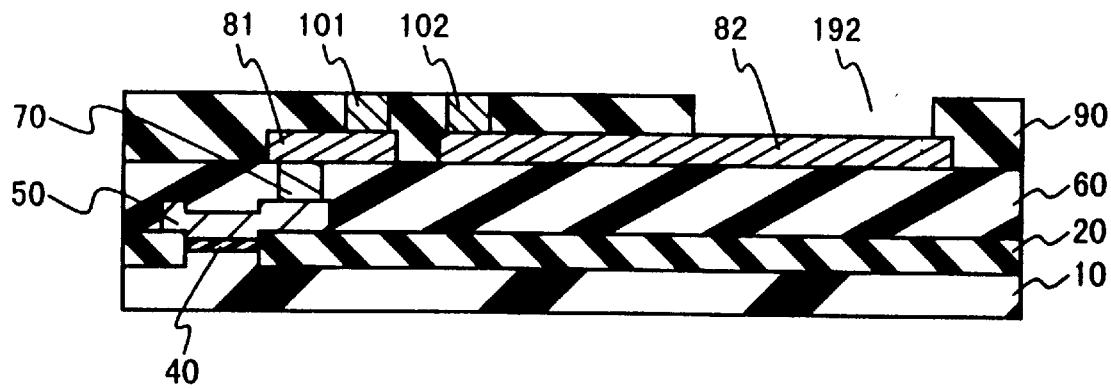
FIGS. 10A to 10F are diagrams showing a method for manufacturing the semiconductor device according to the third embodiment of the present invention.

Next, as shown in FIG. 10A, the opening 192 is formed on the first wiring section 82 by using a photo-resist pattern having a predetermined shape as a mask to penetrate the second insulating film 90.

Figure 10B:
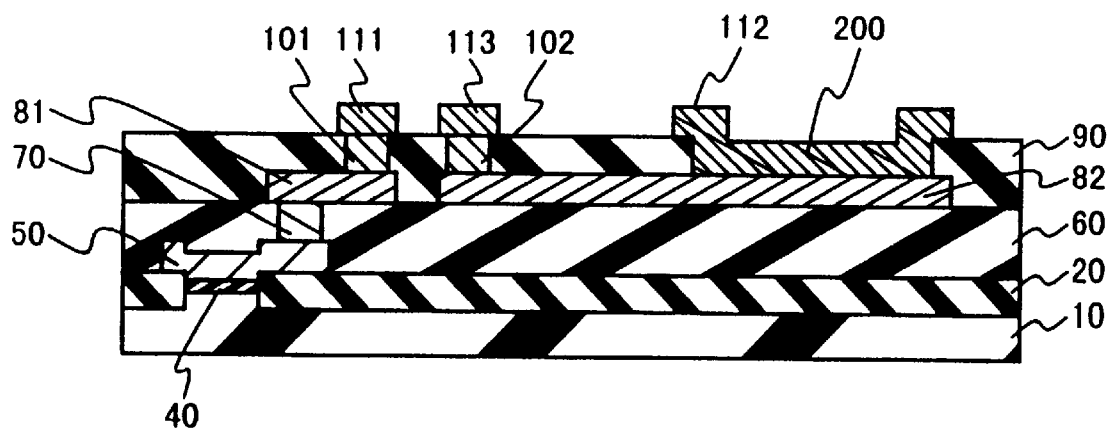

Next, as shown in FIG. 10B, the second wiring 110 is produced on the second insulating film 90 containing the first contacts 101 and 102, and the first wiring section 82 exposed through the opening 192, similarly to the first wiring method. The second wiring 110 is composed of the wiring section 111 connected to the gate electrode 50, the wiring section 112 and the wiring section 113. The wiring section 112 is not connected to the gate electrode 50 and is overlapped with the part of the first wiring section 82 on the entire surface of the opening 192. The wiring section 113 is not connected to the gate electrode 50 and is connected to the first contact 102.

Figure 10C:
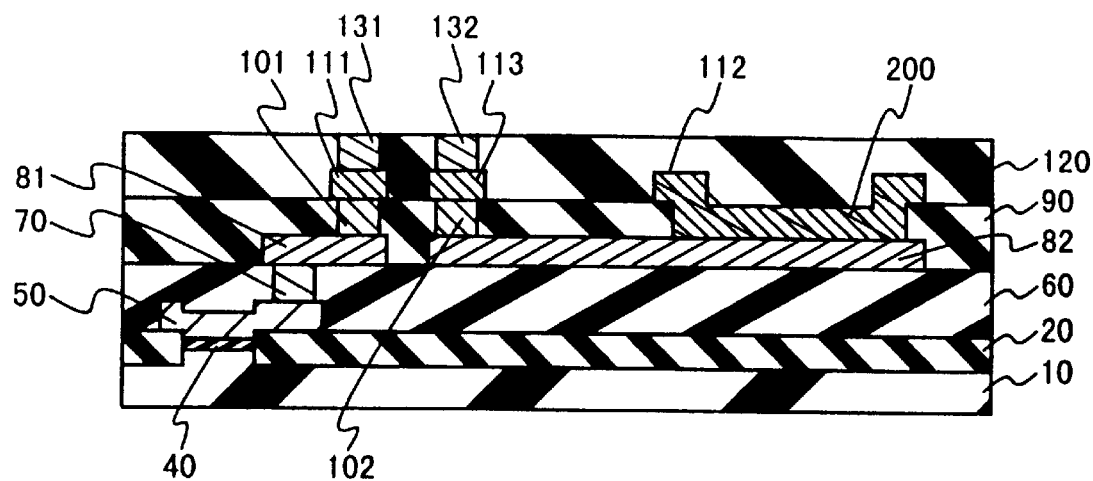

Next, as shown in FIG. 10C, the second contact 130 is formed at the same process as that of forming the first contact. The second contact 130 is composed of the contact 131 and the contact 132. The contact 131 passes through the third insulating film 120 and is connected to the gate electrode 50, and the contact 132 is not connected to the gate electrode.

Figure 10D:
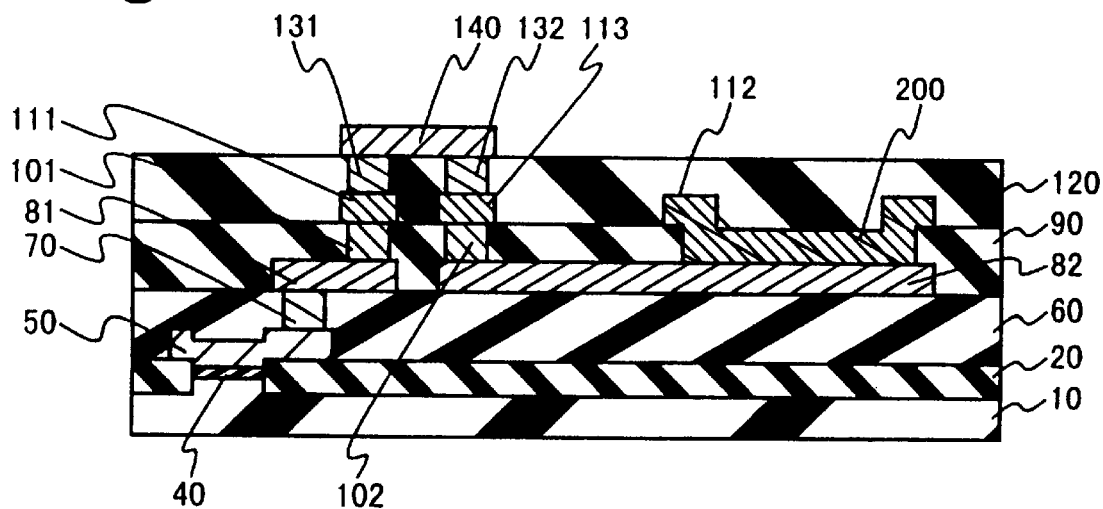

Next, as shown in FIG. 10D, the third wiring 140 is formed on the third insulating film 120 including the second contacts 131, 132, through the same process as that of forming the first wiring 80. The third wiring 140 is intended to connect the second contacts 131 and 132 to each other. Thus, the area of the third wiring 140 can be small.

Figure 10E:
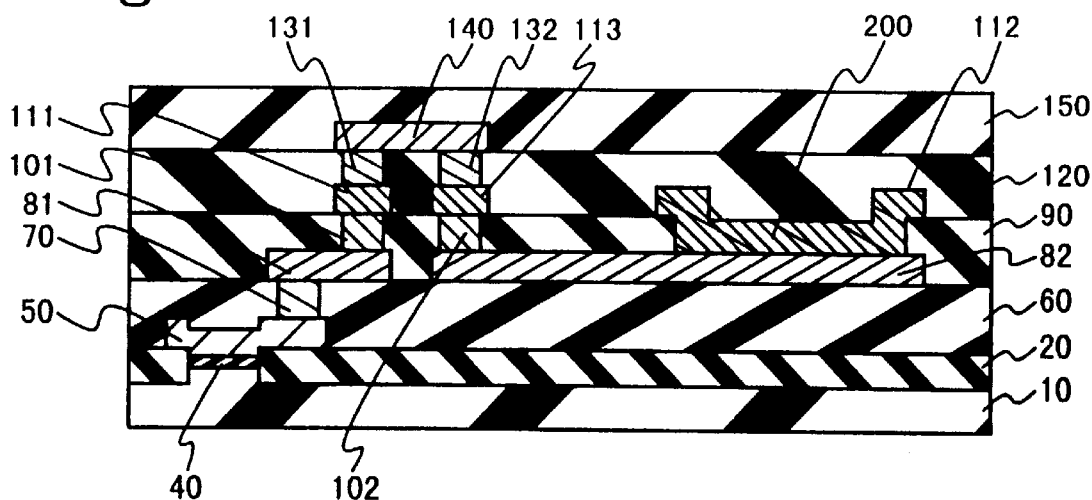

Next, as shown in FIG. 10E, the passivation film 180 for protecting the whole portion including the third wiring 140 is formed by using the single or the combination of the SiN film, the SiON film, the SiO$_2$ film and/or the polyimide film.

Figure 10F:
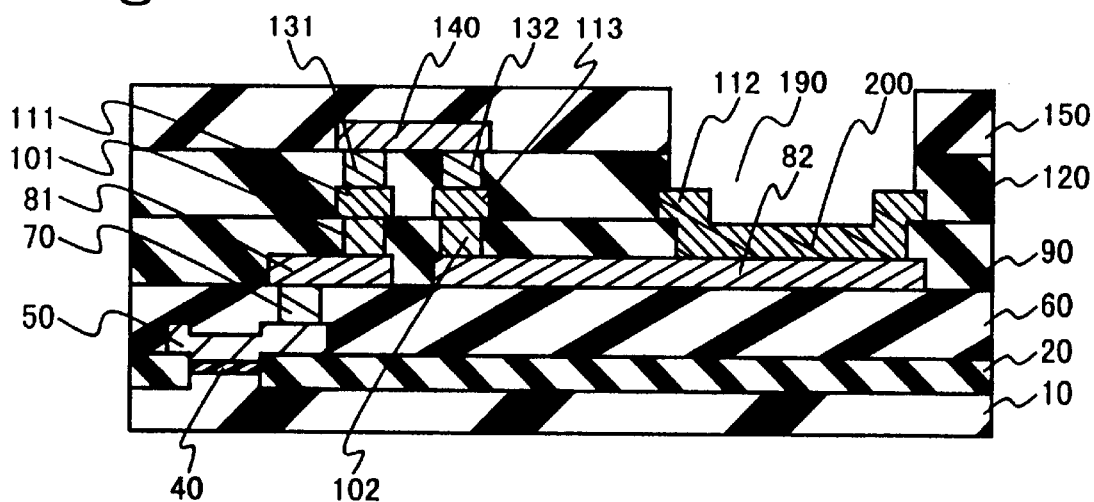

Next, as shown in FIG. 10F, the third insulating film 120 and the passivation film 180 on the pad electrode 200 are removed so that the pad opening 190 is formed to be connected to the pad electrode 200. A method for forming the pad opening 190 is similar to that of the first embodiment of the present invention.

The same effect as in the first embodiment can be also attained in the third embodiment of the present invention to prevent the plasma damage is not brought about when the pad electrode 200 is formed. Also, the similar effect can be attained with regard to the damage reduction in the ashing process after the wiring is formed and in the process for forming the interlayer insulating film by using the plasma CVD method after the wiring is formed.

It is desirable that the film thickness of the pad electrode for bonding is thick in order to endure the mechanical shock at a time of bonding. However, since the film thickness of the wiring is determined based on the easiness of a manufacturing process, the capacity between the wirings and the like, the wiring having the necessary thickness can not often be provided only by a single film. For this reason, a well-known method is used in which a plurality of wiring layers are laminated to make the pad electrode thicker. The third embodiment of the present invention is applied to the case in which the pad electrode 200 is made thicker as mentioned above.

Figure 7:
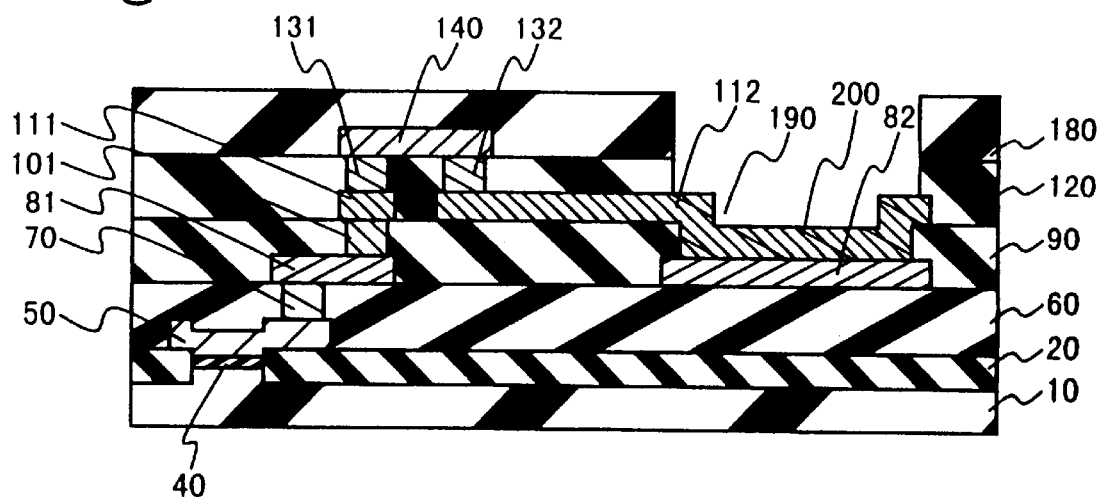
FIG. 7 is a diagram showing the semiconductor device according to a first modification of the third embodiment of the present invention.

FIG. 7 is a cross-sectional view showing a first modification example of the semiconductor device according to the third embodiment of the present invention. The first modification example of the semiconductor device according to the third embodiment of the present invention will be described with reference to FIG. 7.

A diffusion layer 30 exists in a region surrounded with a field oxide film 20 for separating an element, on a surface of a semiconductor substrate 10. A gate electrode 50 is disposed through a gate oxide film 40, which is on the semiconductor substrate 10. A first insulating film 60 is disposed on the whole portion including the gate electrode 50 and the field oxide film 20. A contact 70 is disposed through the first insulating film 60 to be connected to the gate electrode 50. A first wiring 80 is disposed on the first insulating film 60 including the surface of the contact 70. The first wiring 80 is composed of a wiring section 81 and a wiring section 82. The wiring section 81 is connected to the gate electrode 50 and the wiring section 82 is not connected to the gate electrode 50 and a part of the wiring section 82 functions as a pad electrode 200. A second insulating film 90 is disposed on the whole portion including the first insulating film 60 and the first wiring 80. A first contact 101 is disposed through the second insulating film 90 to be connected to the wiring sections 81 which is connected to the gate electrode 50. Moreover, in addition to the contact 101, an opening 192 is formed through the second insulating film 90 to be connected to the wiring section 82.

A second wiring 110 is disposed on the second insulating film 90. The second wiring 110 is composed of a wiring section 111 and a wiring section 112. The wiring section 111 is connected to the gate electrode 50, and the wiring section 112 is not connected to the gate electrode 50. A part of the wiring section 112 functions as the pad electrode 200. A part of the wiring section 112 is overlapped with the first wiring section 82, in the opening 192. A third insulating film 120 is disposed over the whole portion including the second wiring sections 111, 112 and the second insulating film 90. Second contacts 131 and 132 are disposed through the third insulating film 120 to be connected to the second wiring sections 111 and 112, respectively. A third wiring 140 is disposed on the third insulating film 120 to be connected through the second contacts 131 and 132 to the second wiring sections 111 and 112. A passivation film 180 made of the silicon nitride film such as the SiN film), the SiON film, the SiO$_2$ film, the polyimide film and the like for protecting the element is disposed on the whole portion including the third insulating film 120 and the third wiring 140. A pad opening 190 is disposed through the passivation film 180 and the second insulating film 90 to be connected to the pad electrode 200.

Next, the method for manufacturing the semiconductor device according to the first modification will be described below with reference to FIGS. 9A and 9B, FIGS. 11A to 11F and FIGS. 10E and 10F.

At first, the field oxide film 20, the diffusion layer 30, the gate oxide film 40, the gate electrode 50, the first insulating film 60 and the contact 70 are formed on the semiconductor substrate 10, at the same steps as the first embodiment shown in FIGS. 9A and 9B.

Figure 11A:
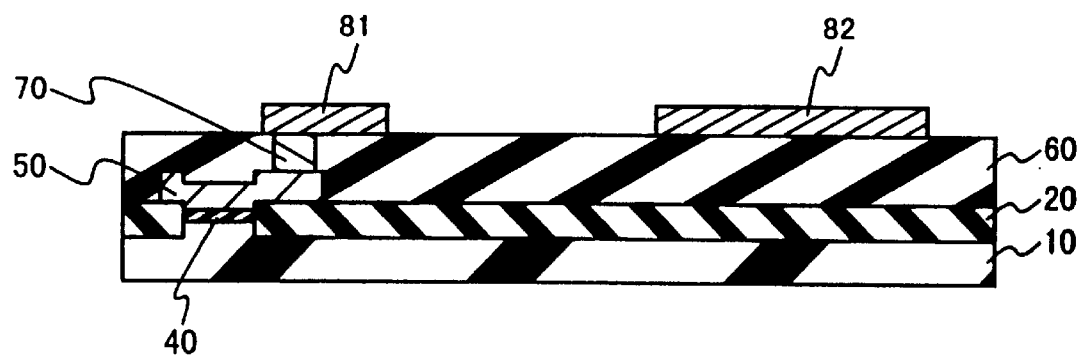
FIGS. 11A to 11F are diagrams showing a method for manufacturing the semiconductor device according to a modification of the third embodiment of the present invention.

Next, as shown in FIG. 11A, the first wiring 80 is formed similarly to the process of forming the first wiring 80 in the first embodiment of the present invention. The first wiring is provided to be composed of the first wiring section 81 connected through the contact 70 to the gate electrode 50 and the first wiring section 82 which is not connected to the gate electrode 50.

Figure 11B:
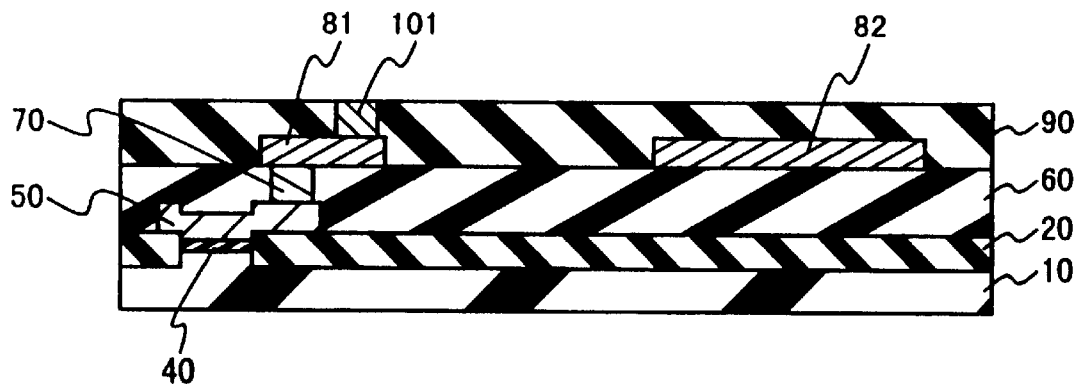

Next, as shown in FIG. 11B, the second insulating film 90 is formed on the whole portion of the first insulating film 60 and the first wiring 80. The process of forming the second insulating film 90 are similarly to the process of forming the second insulating film in the first embodiment of the present invention.

Next, the first contact 100 is formed to be connected to the gate electrode 50, similarly to the process of forming the first contact in the first embodiment of the present invention.

Figure 11C:
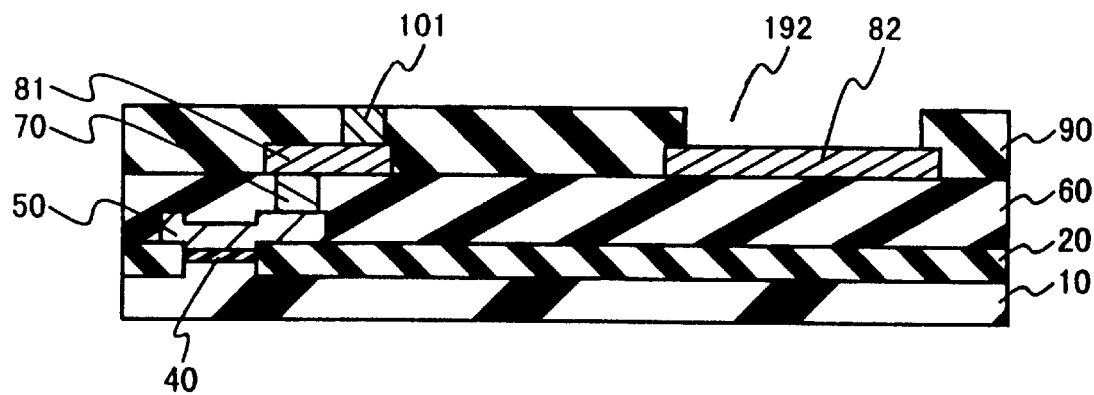

Next, as shown in FIG. 11C, the opening 192 penetrating the second insulating film 90 is formed on the first wiring section 82, by using a photo-resist having a predetermined shape as a mask.

Figure 11D:
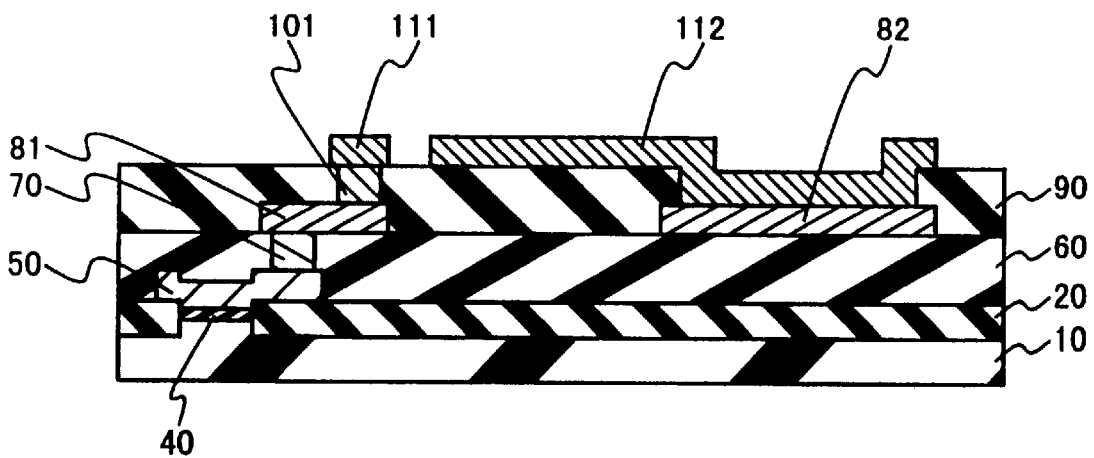

Next, as shown in FIG. 11D, the second wiring 110 is formed on the second insulating film 90 containing the first contacts 101 and 102, and a part of the first wiring 80 through the opening 192, similarly to the process of generating the first wiring 80. The second wiring 110 is provided to be composed of the wiring section 111 connected to the gate electrode 50 and the wiring section 112 which is not connected to the gate electrode 50. A part of the wiring section 112 overlaps with a part of the first wiring 80 through the opening 192.

Figure 11E:
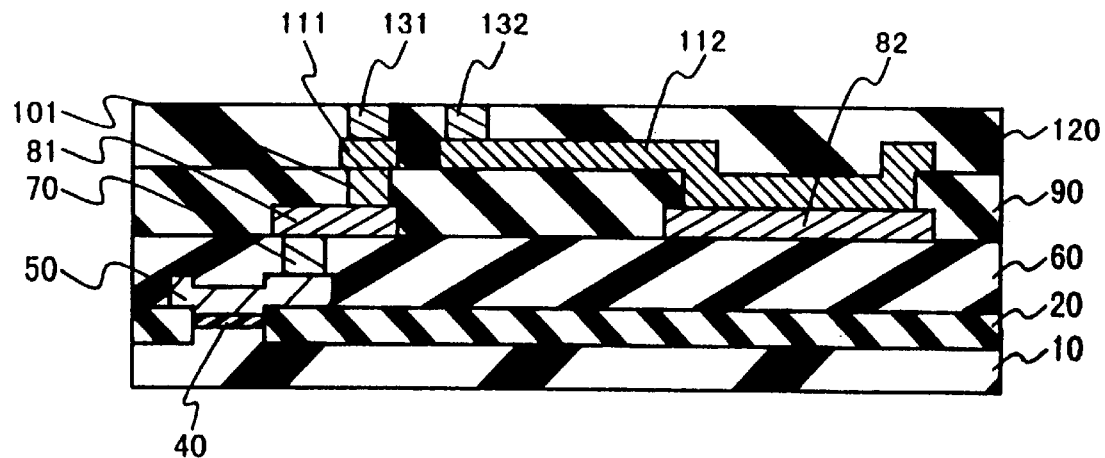

Next, as shown in FIG. 11E, the third insulating film 90 is formed similarly to the process of forming the second insulating film 90.

Next, the second contacts 131 and 132 are formed similarly to the method for forming the first contact 100. The second contact 131 passes through the third insulating film 120 to be connected to the gate electrode 50, and the second contact 132 is not connected to the gate electrode 50.

Figure 11F:
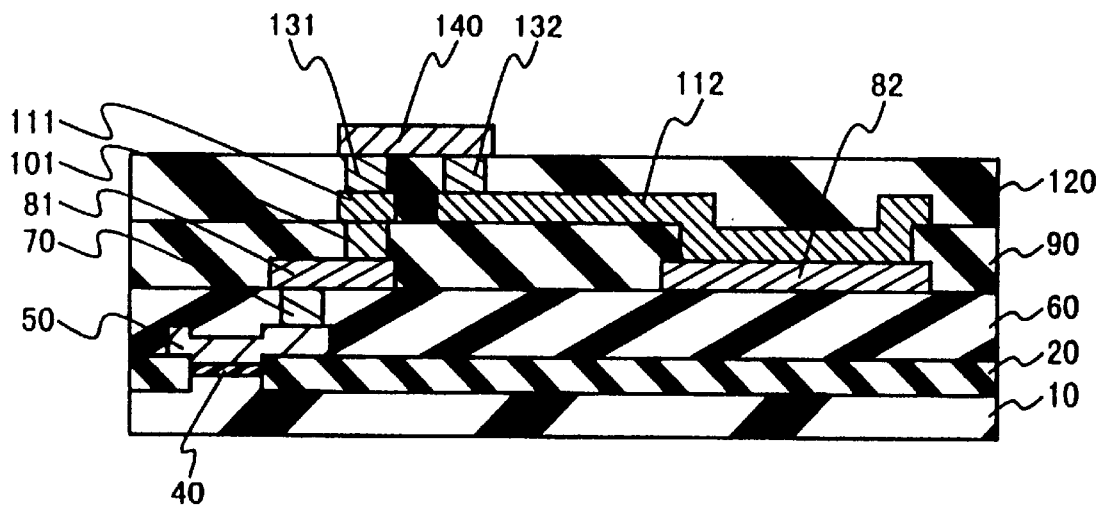

Next, as shown in FIG. 11F, the third wiring 140 is formed on the third insulating film 120 including the second contacts 131 and 132, similarly to the process of forming the first wiring 80. The third wiring 140 is intended to connect the second contacts 131 and 132 to each other. Thus, the area of the third wiring 140 can be small.

Next, as shown in FIGS. 10E to 10F, the passivation film 180 and the pad opening 190 are formed. The process of forming them is similarly to the process of forming them in the third embodiment of the present invention.

The first modification can accomplish the same advantage as in the first embodiment in that the plasma damage is not brought about when the pad electrode 200 is formed. Also, the same effect can be attained with regard to the damage reduction in the ashing process after the wiring is formed and in the process for forming the interlayer insulating film by using the plasma CVD method after the wiring is formed.

This first modification example may be also applied to the case in which the pad electrode 200 is made thicker, similarly to the third embodiment.

The different point of the first modification example from the third embodiment is in that the pad electrode 200 is connected through the first wiring section 82 and the second wiring section 112 to the gate electrode 50. This requires that the connection from the pad electrode 200 to the gate electrode 50 is formed through various wiring layers, depending on a layout of a whole circuit. According to FIGS. 6 and 7, the connection to the gate electrode 50 can be formed through any of the first wiring section 82 and the second wiring section 112, which provides an advantage of increased latitude in the layout.

Figure 8:
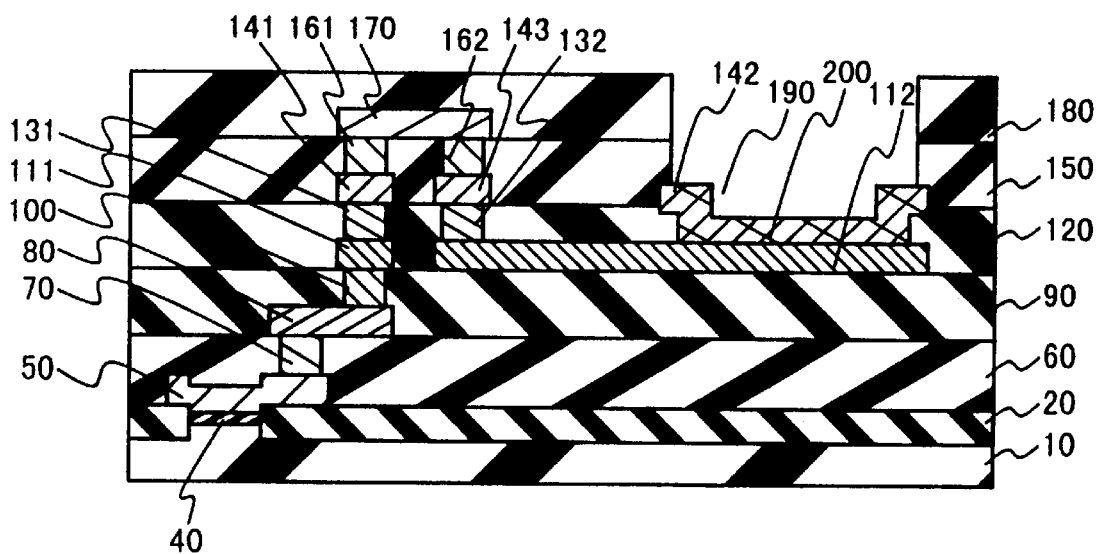
FIG. 8 is a diagram showing the semiconductor device according to a second modification of the third embodiment of the present invention.

FIG. 8 is a cross-sectional view showing a second modification example of the structure of the semiconductor device according to the third embodiment of the present invention. The second modification example of the structure of the semiconductor device will be described with reference to FIG. 8.

A diffusion layer 30 exists in a region surrounded with a field oxide film 20 for separating an element, on a surface of a semiconductor substrate 10. A gate electrode 50 is disposed through a gate oxide film 40, which is formed on the semiconductor substrate 10. A first insulating film 60 is disposed on the whole portion including the gate electrode 50 and the field oxide film 20. A contact 70 is disposed through the first insulating film 60 to be connected to the gate electrode 50. A first wiring 80 is disposed on the first insulating film 60 including the surface of the contact 70 to be connected to the gate electrode 50. A second insulating film 90 is disposed on the whole portion including the first insulating film 60 and the first wiring 80. A first contact 100 is disposed through the second insulating film 90 to be connected to the first wiring 80.

A second wiring 110 is disposed on the second insulating film 90. The second wiring 110 is provided to be composed of a wiring section 111 and a wiring section 112. The wiring section 111 is connected to the gate electrode 50 and the wiring section 112 for a pad electrode 200 is not connected to the gate electrode 50. A third insulating film 120 is disposed on the whole portion including the second wiring sections 111, 112 and the second insulating film 90. Second contacts 131 and 132 are disposed through the third insulating film 120 to be connected to the second wiring sections 111 and 112, respectively. In addition to the second contacts 131 and 102, an opening 192 is formed through the third insulating film 120.

A third wiring 140 is disposed on the third insulating film 120. The third wiring 140 is composed of a third wiring section 141, a third wiring section 142 and a third wiring section 143. The third wiring section 141 is connected to the gate electrode 50, and the third wiring section 142 is not connected to the gate electrode 50. A part of the third wiring section functions as a pad electrode 200. The third wiring section 143 is not connected to the gate electrode 50 and is located on the second contact 132. A part of the third wiring section 142 is overlapped with a part of the second wiring section 112 in the whole area of the opening 192. A fourth insulating film 150 is disposed on the whole portion including the third wiring sections 141, 142 and 143 and the third insulating film 120. Third contacts 161 and 162 are disposed through the fourth insulating film 150 to be connected to the third wiring sections 141 and 143, respectively. A fourth wiring 170 is disposed on the fourth insulating film 150 to be connected through the third contacts 161 and 162 to the third wiring sections 141 and 143. A passivation film 180 made of the silicon nitride film such as the SiN film, the SiON film, the $SiO_2$ film, the polyimide film and the like for protecting the element is disposed over the whole portion including the fourth insulating film 150 and the fourth wiring 170. A pad opening 190 is disposed through the passivation film 180 and the fourth insulating film 90 to be connected to the pad electrode 200.

Next, the method for manufacturing the semiconductor device according to the second modification example will be described below with reference to FIGS. 9A and 9B, and FIGS. 10A to 10F.

At first, the field oxide film 20, the diffusion layer 30, the gate oxide film 40, the gate electrode 50, the first insulating film 60 and the contact 70 are formed on the semiconductor substrate 10, at the same processes as those in the first embodiment shown in FIGS. 9A and 9B.

Next, the first wiring 80, the first insulating film 90 and the first contact 100 are formed. The processes of forming the first wiring 80, the first insulating film 90, and the first contact 100 are the same as the processes of forming the first wiring 80, the first insulating film 90 and the first contact 100 in the first embodiment respectively.

Next, the second wiring 110, the third insulating film 120, the second contact 130, the third wiring 140, the fourth insulating film 150, the third contact 160, the fourth wiring 170, the passivation film 180, the pad opening 190 and the pad electrode 200 are formed. The processes of forming the second wiring 110, the third insulating film 120, the second contact 130 the third wiring 140, the fourth insulating film 150, the third contact 160, the fourth wiring 170, the passivation film 180, the pad opening 190 and the pad electrode 200 are the same as processes of manufacturing the semiconductor device according to the third embodiment shown in FIGS. 10 to 10F. However, a process of forming the contact 70 is adopted as a process of forming the first contact 100. The process of forming the first wiring sections 81 and 82 is adopted as a process of forming the second wiring sections 111 and 112. The process of forming the second insulating film 90 is adopted as a process of forming the third insulating film 120. The process of forming the first contacts 101 and 102 is adopted as a process of forming the second contacts 131 and 132. The process of forming the second wiring sections 111, 112 and 113 is adopted as a process of forming the third wiring sections 141, 142 and 143. The process of forming the third insulating film 120 is adopted as a process of forming the third insulating film 150. The process of forming the second contacts 131 and 132 is adopted as a process of forming the third contacts 161 and 162. The process of forming the third wiring 140 is adopted as a process of forming the fourth wiring 170.

The second modification example can attain the same effect as in the first embodiment in that the plasma damage is not brought about when the pad electrode 200 is formed. Also, the same effect can be attained with regard to the damage reduction in the ashing process after the wiring is formed and in the process for forming the interlayer insulating film by using the plasma CVD method after the wiring is formed.

The second modification example is also applied to the case in which the pad electrode 200 is made thicker, similarly to the third embodiment.

The second modification example is composed of four wiring layers but the third embodiment is composed of three wiring layers. Moreover, the pad electrode 200 is connected through the first wiring section 82 to the gate electrode 50 in the second modification example, and the pad electrode 200 is connected through the second wiring section 112 to the gate electrode 50 in the third embodiment.

The third embodiment provides the advantage of increasing the variations of the layouts in the whole circuit, as shown in FIGS. 6, 7 and 8.

The effect of the present invention can prevent the plasma damage from occurring when the pad electrode is etched. This is because the pad electrode is unconnected with the gate electrode when the pad electrode is etched. Accordingly, the area of the wiring section directly connected to the gate electrode can be made sufficiently small, and the antenna ratio can be reduced to one several hundredths, compared with the conventional case. As a result, the reliability of the gate oxide film can be extremely improved, as compared with the conventional technique.

The reduction of the plasma damage that occurs when the wiring is etched has been described. The similar effect can be attained with regard to the damage reduction in the ashing process after the wiring is formed and in the process for forming the interlayer insulating film by using the plasma CVD method after the wiring is formed.

Furthermore, in the present invention, the wiring layers to constituting the pad electrode are not formed last. Therefore, the present invention can be applied if the wiring layers are composed of more than two layers.

What is claimed is:

1. A semiconductor device, comprising:
    a metal oxide semiconductor (MOS) transistor formed on a semiconductor substrate to have a gate electrode which is formed on a gate oxide film;
    a first insulating layer covering said semiconductor substrate and said MOS transistor;
    a second insulating layer covering said first insulating layer;
    a first wiring structure formed on said first insulating layer, a part of said first wiring structure passing through said second insulating layer;
    a second wiring structure which is not directly connected to said first wiring structure, which passes through said first and second insulating layers to be connected to said gate electrode, and which has an antenna ratio of equal to or less than 1000; and
    a third wiring structure connected to said first and second wiring structures and formed on said second insulating layer to have the antenna ratio of equal to or less than 1000, and
    wherein the antenna ratio is a ratio of surface area of a wiring structure to surface area of a gate oxide film.

2. A semiconductor device according to claim 1, further comprising:
    a passivation film covering said third wiring structure and said second insulating layer; and
    a first opening formed to pass through said second insulating layer and said passivation film and connected to said first wiring structure.

3. A semiconductor device according to claim 1, wherein a part of each of said first and second wiring structures passes through said second insulating layer and extends vertically upward.

4. A semiconductor device according to claim 1, wherein said first insulating layer includes a third insulating layer and a fourth insulating layer formed on said third insulating layer, and
    said semiconductor device further comprises:
        a fourth wiring structure formed on said third insulating layer without being not connected to said second wiring structure; and
        a second opening formed on said fourth wiring structure to pass through said fourth insulating layer, wherein a part of said first wiring structure on said first insulating layer is overlapped with said fourth wiring structure through said second opening.

5. A semiconductor device according to claim 1, wherein said second insulating layer includes a fifth insulating layer and a sixth insulating layer formed on said fifth insulating layer, further comprising:
    a third opening formed on said first wiring structure to pass through said fifth insulating layer; and
    a fifth wiring structure formed on said fifth insulating layer and said third opening, a part of said fifth wiring structure being overlapped with a part of said first wiring structure through said third opening without being not connected to said second wiring structure.

6. A semiconductor device according to claim 3, wherein said second insulating layer includes a seventh insulating layer and a eighth insulating layer formed on said seventh insulating layer, and wherein a part of said first wiring structure comprises:
- a first wiring portion formed on said first insulating layer;
- a second wiring portion formed on said seventh insulating layer;
- a first contact formed to pass through said seventh insulating layer and to connect said first wiring portion and said second wiring portion; and
- a second contact formed to pass through said eighth insulating layer to be connected to said second wiring portion, and wherein a part of said second wiring structure comprises:
- a third wiring portion formed on said first insulating layer;
- a fourth wiring portion formed on said seventh insulating layer;
- a third contact formed to pass through said seventh insulating layer and to connect said third wiring portion and said fourth wiring portion; and
- a fourth contact formed to pass through said eighth insulating layer to be connected to said fourth wiring portion.

7. A semiconductor device according to claim 4, wherein a part of said first wiring structure passes through said fourth insulating layer and said second insulating layer and extends vertically upward.

8. A semiconductor device according to claim 6, wherein each of said first to fourth contacts comprises a tungsten plug.

* * * * *

UNITED STATES PATENT AND TRADEMARK OFFICE
CERTIFICATE OF CORRECTION

PATENT NO.: 6,075,292
DATED: June 13, 2000
INVENTOR(S): Ko NOGUCHI

It is certified that error(s) appears in the above-identified patent and that said Letters Patent is hereby corrected as shown below:

Column 2, line 23 after "wiring" insert --80--.

line 55 after "wiring" insert --8---.

line 63 after "wiring" insert --80--.

Column 3, line 9 after "wiring" insert --80--.

line 11 after "wiring" insert --80--.

line 16 after "wiring" insert --80--.

Signed and Sealed this

Tenth Day of April, 2001

NICHOLAS P. GODICI

Attest:

Attesting Officer      Acting Director of the United States Patent and Trademark Office